(12) United States Patent
Fan et al.

(10) Patent No.: US 8,272,757 B1
(45) Date of Patent: Sep. 25, 2012

(54) LIGHT EMITTING DIODE LAMP CAPABLE OF HIGH AC/DC VOLTAGE OPERATION

(75) Inventors: Zhaoyang Fan, Manhattan, KS (US); Hongxing Jiang, Manhattan, KS (US); Jingyu Lin, Manhattan, KS (US)

(73) Assignee: AC LED Lighting, L.L.C., Lubbock, TX (US)

( * ) Notice: Subject to any disclaimer, the term of this patent is extended or adjusted under 35 U.S.C. 154(b) by 268 days.

(21) Appl. No.: 11/144,982

(22) Filed: Jun. 3, 2005

(51) Int. Cl.
*F21V 9/00* (2006.01)

(52) U.S. Cl. .......... 362/231; 257/99; 257/778; 362/800

(58) Field of Classification Search .................. 362/231; 315/185 S, 200 A, 312, 316; 257/79, 81–84, 257/86, 88, 89, 99, 100
See application file for complete search history.

(56) References Cited

U.S. PATENT DOCUMENTS

| | | |
|---|---|---|
| 3,849,707 A | 11/1974 | Braslau et al. |
| 3,900,863 A | 8/1975 | Kim |
| 5,278,432 A | 1/1994 | Ignatious et al. |
| 5,317,170 A | 5/1994 | Paoli |
| 5,463,280 A | 10/1995 | Johnson |
| 5,563,422 A | 10/1996 | Nakamura et al. |
| 5,652,434 A | 7/1997 | Nakamura et al. |
| 5,699,073 A | 12/1997 | Lebby et al. |
| 5,767,581 A | 6/1998 | Nakamura et al. |
| 5,773,130 A | 6/1998 | So et al. |
| 5,877,558 A | 3/1999 | Nakamura et al. |
| 5,929,466 A | 7/1999 | Ohba et al. |
| 5,952,680 A | 9/1999 | Strite |
| 5,955,748 A | 9/1999 | Nakamura et al. |
| 5,966,393 A | 10/1999 | Hide et al. |
| 6,054,724 A | 4/2000 | Ogihara et al. |
| 6,093,965 A | 7/2000 | Nakamura et al. |
| 6,316,793 B1 | 11/2001 | Sheppard et al. |
| 6,410,940 B1 | 6/2002 | Jiang et al. |
| 6,455,878 B1 | 9/2002 | Bhat et al. |
| 6,461,019 B1 | 10/2002 | Allen |
| 6,547,249 B2 | 4/2003 | Collins et al. |
| 6,552,373 B2 | 4/2003 | Ando et al. |

(Continued)

OTHER PUBLICATIONS

S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.

(Continued)

*Primary Examiner* — Evan Dzierzynski
(74) *Attorney, Agent, or Firm* — Lathrop & Gage LLP

(57) ABSTRACT

A solid-state LED lighting lamp (SSL-LED lamp), based on AC or DC-emitters, which runs under a high AC or DC voltage, with high light generation capability, high reliability and long lifespan, is disclosed. A plurality of AC or DC-emitter chips are integrated on a thermally conductive submount and the electrically conductive element pathways on the submount provide electrical interconnections between the mounted chips and also between the individual LEDs on each chip. The conducting elements also provide redundant current paths at the AC or DC-emitter chip level and individual LED level. Depending on the detail design, the LED SSL-lamp may be directly powered by an AC voltage (i.e. 110/120V or 220/240V power grid) or a high DC voltage. With this design, the LED SSL-lamp can provide sufficient illumination to replace the incandescent or florescent light bulbs for general lighting purpose. The distributed emitter array design ensures the heat dissipation. The redundant current path design ensures the long lifespan and high reliability.

24 Claims, 15 Drawing Sheets

U.S. PATENT DOCUMENTS

| | | | |
|---|---|---|---|
| 6,635,902 B1 | 10/2003 | Lin et al. | |
| 6,740,960 B1 | 5/2004 | Farnworth et al. | |
| 6,787,820 B2 | 9/2004 | Inoue et al. | |
| 6,936,855 B1* | 8/2005 | Harrah | 257/88 |
| 6,957,899 B2 | 10/2005 | Jiang et al. | |
| 6,992,319 B2 | 1/2006 | Fahimulla et al. | |
| 6,999,318 B2* | 2/2006 | Newby | 361/719 |
| 7,045,965 B2 | 5/2006 | Li et al. | |
| 7,156,538 B2* | 1/2007 | Han et al. | 362/249 |
| 7,204,607 B2* | 4/2007 | Yano et al. | 362/231 |
| 7,210,819 B2 | 5/2007 | Jiang et al. | |
| 7,213,942 B2 | 5/2007 | Jiang et al. | |
| 7,221,044 B2 | 5/2007 | Fan et al. | |
| 7,285,801 B2* | 10/2007 | Eliashevich et al. | 257/96 |
| 2001/0032985 A1* | 10/2001 | Bhat et al. | 257/88 |
| 2002/0006040 A1 | 1/2002 | Kameda et al. | |
| 2002/0043943 A1 | 4/2002 | Menzer et al. | |
| 2002/0158258 A1 | 10/2002 | Chyi | |
| 2003/0057434 A1 | 3/2003 | Hata et al. | |
| 2003/0102482 A1 | 6/2003 | Saxler | |
| 2003/0116774 A1 | 6/2003 | Yamamoto et al. | |
| 2003/0178633 A1 | 9/2003 | Flynn et al. | |
| 2003/0218183 A1 | 11/2003 | Micovic et al. | |
| 2004/0080941 A1 | 4/2004 | Jiang et al. | |
| 2004/0129946 A1 | 7/2004 | Nagai et al. | |
| 2004/0195562 A1 | 10/2004 | Munns | |
| 2004/0206970 A1 | 10/2004 | Martin | |
| 2005/0063165 A1* | 3/2005 | Chang et al. | 361/771 |
| 2005/0127816 A1 | 6/2005 | Sumitani | |
| 2005/0133816 A1 | 6/2005 | Fan et al. | |
| 2005/0161682 A1* | 7/2005 | Mazzochette et al. | 257/79 |
| 2005/0185401 A1 | 8/2005 | Jiang et al. | |
| 2005/0207165 A1* | 9/2005 | Shimizu et al. | 362/362 |
| 2005/0251698 A1* | 11/2005 | Lynch et al. | 713/322 |
| 2005/0253151 A1 | 11/2005 | Sakai et al. | |
| 2005/0253161 A1* | 11/2005 | Horio et al. | 257/100 |
| 2005/0254243 A1* | 11/2005 | Jiang et al. | 362/249 |
| 2006/0044864 A1 | 3/2006 | Lin et al. | |
| 2006/0113548 A1* | 6/2006 | Chen et al. | 257/79 |
| 2006/0163589 A1 | 7/2006 | Fan et al. | |
| 2006/0169993 A1 | 8/2006 | Fan et al. | |
| 2006/0180818 A1 | 8/2006 | Nagai et al. | |
| 2006/0181877 A1* | 8/2006 | Sidwell | 362/294 |
| 2006/0208264 A1 | 9/2006 | Ryu et al. | |
| 2006/0239002 A1* | 10/2006 | Chou et al. | 362/249 |
| 2007/0273299 A1 | 11/2007 | Miskin et al. | |

OTHER PUBLICATIONS

Mair et al., Optical properties of GaN/AlGaN multiple quantum well microdisks, Nov. 17, 1997, Appl. Phys, Lett. 76 (5) p. 631, American Institute of Physics.

Jiang and Lin; Advances in iii-Nitride Micro-size light Emitters; Advanced Semiconductor Magazine; vol. 14, No. 5.

Chen, Chang, Chen, Fann, Jiang, and Lin; Mechanism of Photoluminescence in GaN/Al (0.2)Ga(0.8)N Superlattices; Applied Physics Letters, vol. 79, No. 23; Dec. 3, 2001.

Jiang and Lin; On Display; OE Magazine Jul. 2001.

Dr. Jing Li; III-Nitride Integrated Photonic Devices (undated).

C. W Jeon, H.W. Choi and M.D. Dawson; A Novel Fabrication Method for a 64 × 64 Matrix-Addressable GaN-Based Micro-LED Array; Phys. Stat. Sol. (a) No. 1, 78-82, 2003.

Zhaoyang Fan; Related and Copending U.S. Appl. No. 11/340,296, filed Jan. 26, 2006.

Kansas Researchers Fabricate Blue Micro Light-Emitting Diodes, Paving Way for Microdisplays, Energy Saving Lighting; Ascribe The Public Interest Newswire, Sep. 27, 2001.

* cited by examiner

LIGHT EMITTING DIODE LAMP CAPABLE OF HIGH AC/DC VOLTAGE OPERATION

CROSS-REFERENCE TO RELATED APPLICATIONS

Not Applicable.

STATEMENT REGARDING FEDERALLY SPONSORED RESEARCH OR DEVELOPMENT

Not applicable.

BACKGROUND OF THE INVENTION

The present invention relates to single-chip semiconductor light emitting diodes (LED), and more particularly to single-chip LEDs as high voltage alternating current (AC) or direct current (DC) semi conductive light emitters coupled together to form a solid-state LED lighting lamp (SSL-LED lamp) with improved illumination capabilities.

The popularity of LEDs in various applications where illumination is needed is on the rise. Although traditionally utilized for indicator lights, background display illumination and other applications where low-level illumination is sufficient, the realization of high brightness blue/green and violet LEDs made from the III-nitride semiconductor family InN, GaN, AlN and their alloys in recent years may enable LEDs to provide sufficient illumination for general lighting applications in residential houses and commercial buildings. One successful method of producing light emissions from LEDs that appear to the human eye to be "white light" is to coat blue LED chips made of III-nitrides with yellow phosphors, such as cerium doped yttrium aluminum garnet (YAG:Ce) crystals in viscous adhesive. The LED chip emits blue light, part of which is converted to visible spectrum yellow light by the YAG:Ce. Through color mixing, and the stimulation of the red and green receptors of the eye by the yellow light, the eye sees the while light when the yellow and blue colors are properly balanced. Because solid-state LEDs are quite efficient in light output per watt of power consumed, and are sufficiently versatile to be capable of use in a variety of locations where illumination is needed, LED lamps have the potential to replace traditional incandescent or fluorescent lamps in many lighting applications. The use of LED lamps, therefore, will enable overall electrical energy consumption to be reduced, thereby lowering the output of carbon-related pollution into the atmosphere. Furthermore, materials used to form LED chips and associated coatings allow LED lamps to be independently tunable in terms of light intensity and visible spectrum color output.

Despite the potential for widespread usage of LED lamps as significant illumination sources, and improvements to the light intensity levels provided, many obstacles still exist to their implementation in many general lighting applications. Conventional semiconductor LEDs operate under low DC voltage (about 1 to 5 volts) with limited current flow (around 20 milliamps), thereby providing a fairly low luminance level. To achieve a high luminance for general lighting applications, semiconductor LEDs would need to run on a much higher input power. Thus, there are efforts to create so-called "high powered LEDs" that run on higher input power generated by high DC or AC voltage. One implementation of a high AC voltage LED lamp is disclosed in U.S. patent application Ser. No. 10/279,296, filed on Oct. 24, 2002, and entitled "Light Emitting Diodes For High AC Voltage Operation and General Lighting", the teachings of which are incorporated herein by reference. The '296 application teaches combining many small LEDs onto a single chip with serial interconnection in achieve a single light emitting device, or lamp. The LED lamp can be configured to have a running voltage of 12V, 24V, 110/120V or 220/240V, or still other values. AC voltages of 110/120 or 220/240, for instance, make the LED lamp compatible with running on standard power sources supplied to houses and buildings in North America or in Europe and Asia, without the need for power converters. This is achieved in the invention of the '296 application by having two columns of individual LEDs each in serial interconnection and wired in opposing polarities such that one column of LEDs is forward biased and the other column is reverse biased, as seen in FIG. 1. The AC current turns on and off the two columns alternately through a 60 Hz cycle so that all the LEDs of the single-chip lamp appear to the naked eye to be illuminated all of the time. Because a sufficient number of LEDs are connected in series, in the case of an AC power supply of 120V about 35 emitters in each series column, each individual LED will have about the same voltage crossing (e.g., about 3.4V) as with a conventional DC operated LEDs, avoiding the danger of greatly exceeding the turn on voltage of the LEDs and causing damage thereto. Another advantage of this design is that power converters, transformers, large PCB boards, and other bulky electronics are not needed to operate with standard 110V or 220V AC current. Therefore, single chip LED lamps can be integrated with standard Edison or European screw bases for direct placement in conventional light bulb fixtures.

The evolution of LED lamp design to incorporate high voltage AC power sources, however, has created another set of issues to address. Semiconductor LEDs still only have a power conversion efficiency of around 10% to 35%, and thus most of the input power is dissipated as heat energy. The p-n junction of the diode, is susceptible to excessive temperatures, which cause the power conversion efficiency to drop and shorten the life of the LED emitter. Because of the difficulty of thermal management, single-chip LEDs have been limited in power consumption (e.g., to about 2 W), and thus emitted light intensity.

Still further, larger semiconductor die sizes utilized with LEDs running under a high current can have a negative effect on light extraction efficiency. Once the input voltage has increased over the value of the turn-on voltage, the current flowing through the LED increases exponentially with the increase in voltage. As input power increases, current will increase at a much faster rate than voltage. The current density level flowing through p-n junction of the LED, however, is limited based on the quality of materials used in the LED. Excessive current density can cause hot spots and non-emissive recombination sits, degrading light output and the lifespan of the device. Therefore, LEDs operating under high current (or "high powered" LEDs) must spread the current over larger p-n junctions, which typically require die sizes at least in the 1×1 mm$^2$ to 2×2 mm$^2$ range. Increasing the die size beyond the aforementioned range would theoretically aid in lowering the p-n junction current density with high powered LEDs, but would also have the effect of reducing the light extraction efficiency from the sidewalls of the die, thereby lowering the overall luminance of the LED. The thermal dissipation of an LED with a large die size and high power is another challenge.

High powered AC LED lamps utilizing serially connected columns of individual LEDs are also at risk of failure due to open circuits or short circuits formed by the individual LED in the series. If one individual LED forms an open circuit, all other LEDs in this series will not work either; if one LED forms a short circuit, the remaining LEDs in the path will encounter an increased voltage and risk of being damaged.

In the following description, "individual LED or "LED" means a single p-n junction light emitting diode; a certain number of individual LEDs are integrated on a single chip to form a high voltage AC/DC "emitter"; a certain number of AC/DC emitters are assembled together with a suitable package and thermal dissipation characteristics in accordance with certain embodiments of the present invention to form a "SSL-LED" lamp, as will be more fully explained herein.

SUMMARY OF THE INVENTION

A robust lighting solution is provided by a solid-state LED lighting lamp (SSL-LED lamp) of the present invention. One aspect of the invention involves using a plurality of single-chip high voltage LED emitters, AC or DC, interconnected by conductive elements, or traces, formed on a submount or board (chip on board, COB). Metallic solder-like bumps may be deposited on the conductive elements, and may serve to bond the LED emitters to the substrate (e.g., on the conductive elements). For instance, the LED emitters may be 110/120 V or 220/240 V AC emitters so that the SSL-LED lamp can replace traditional incandescent or fluorescent lamps for general lighting purposes. As will be explained more fully below, certain embodiments of the invention provide a conductive path design that is redundant to increase the reliability of the SSL-LED lamp by bypassing failed individual LEDs or LED emitters (i.e., concentration of interconnected LEDs on a single chip) to avoid open and short circuits and extend the life of the remaining LEDs and LED emitters. Additionally, certain embodiments of the invention provide a more uniform thermal distribution and increased thermal dissipation capability, while maintaining a compact LED lamp design.

In accordance with one embodiment, the SSL-LED lamp includes a submount for mounting a plurality of high voltage DC-emitters, the DC-emitters formed of an array of serially connected small-size light emitting diodes integrated on one chip, as well as conductive elements or traces interconnecting the DC-emitters, thereby forming a DC-SSL-lamp running on DC power. Optionally, the DC-emitters are bonded to the submount in facing-down relation through metallic solder-like bumps attached with the conductive elements. Through redundant or bypassing-type electrical connections provided by the conductive elements, partial or complete failure of an emitter will not compromise the integrity of the remaining emitters of the SSL-LED lamp. Additionally, the grid or bypassing-type electrical connections and thermal conductivity of the metallic bumps aid in more evenly distributing thermal energy created by the individual LEDs of the emitters, as well as more efficiently dissipating the thermal energy into the surrounding environment. By avoiding "hot spots", the lifespan of an SSL-LED lamp is improved.

The single chip high voltage DC-emitters include serially connected individual LEDs of a generally small size that are integrated together on the emitter chip. The electrodes of these individual LEDs may also connected to the submount through the isolated metallic solder-like bumps, enabling the rapid transfer of heat generated by current flows through the p-n junction can be rapidly transferred into the submount. In another structure, the individual LEDs in the emitter are not serially connected on the emitter chip; instead, they are connected in serial by the conductive elements on the submount. Furthermore, such an electrical connection can also provide redundant or bypassing-type current paths at the individual LED level to further improve the reliability of the emitters and hence the SSL-LED lamp.

Another embodiment of the SSL-LED lamp shares a number of components with the aforementioned lamp, but is configured to be used in high AC voltage applications as opposed to with DC voltage power sources. In one AC-SSL-lamp configuration, the plurality of single chip high voltage DC-emitters are instead partitioned into two groups or columns and arranged in such a way to provide two reversed-direction current paths, corresponding to the positive and negative cycles of AC voltage. As a result, the current and voltage waves can be kept in phase as much as possible to improve the power factor requirement of the power grid. In these AC-SSL-lamps, redundant or bypassing-type current paths at the emitter level (e.g., by the conductive elements) and the individual LED level may also be incorporated into the lamp design.

In another embodiment, the AC-SSL-lamp is built by a plurality of AC-emitters integrated onto one submount. Varying from the aforementioned configurations by DC-emitters, each individual AC-emitter chip has already incorporated two reversed-direction current paths. Similar with the forgoing configurations, the conductive elements on the submount may be arranged to provide redundant structures and current flow paths to improve the AC-SSL-lamp reliability. The interconnection between the individual small-size LEDs on each AC-emitter can be fulfilled on the AC-emitter chip through conductive pathways, or through the connection metallic bumps and the conductive elements on the submount. Optionally, redundant or bypassing-type current paths at the emitter level and the individual LED level are also provided. Specifically, 110V/120V AC-SSL-lamps can be built with a plurality of 110V/120V AC-emitters, and 220V/240V AC-SSL-lamps can be built with a plurality of 220V/240V AC-emitters.

In a standard configuration for the various SSL-LED lamp embodiments of the present invention, two electrodes are provided to connect to the applied voltage. Because the type of individual LEDs chosen will dictate an optimal range of voltages during lamp operation, the voltage source (e.g., DC or AC, at a particular supplied voltage) will ultimately dictate the lamp design. To increase the flexibility, in another embodiment, the SSL-LED lamp has more than two electrodes. Depending on the applied voltage, the corresponding electrodes may be connected to provide optimal voltage ranges to the various individual LEDs (e.g., 3.4 volts for a typically blue LED).

In the aforementioned embodiments, the SSL-LED lamp runs under a considerable high power level to have sufficient light emission for general-purpose illumination. Another aspect of the invention is the use of a highly thermally conductive submount to substantially improve thermal management, thereby maintaining good lamp performance and long life. This submount must also have a top surface, in contact with the conductive elements, that is electrically insulative. As such, the submount may be provided which is made of thermally-conductive electrically-insulating materials such as AlN and Si, or another category of materials knows as insulator covered metals, such as low-temperature co-fired ceramic-on-metal (LTCC-M), aluminum silicon carbide (Al-SiC) metal matrix composite materials, and metal-core board. As is well known, submounts may be fit with adaptors and other structure so that the SSL-LED lamp may be fitted in a universal lighting fixture (e.g., a screw base, housing, optics to direct and/or focus the emitted light, active and passive cooling mechanisms, if needed).

In the forgoing inventions, protective devices can be integrated on the submount or embedded in the fixture. Each DC or AC-emitters mounted on the submount may also be individually encapsulated, or encapsulated with adjacent emitters, for improved light extraction and protection.

BRIEF DESCRIPTION OF THE SEVERAL VIEWS OF THE DRAWINGS

In the accompanying drawings, which form a part of the specification and are to be read in conjunction therewith and in which like reference numerals are employed to indicate like parts in the various views.

DETAILED DESCRIPTION OF THE INVENTION

The various figures described in detail below show the solid-state LED lighting lamp (SSL-LED lamp) of the present invention utilizing a plurality of single-chip high voltage LED emitters for a robust general illumination solution. The embodiments of the SSL-LED lamp configurations disclosed may be used with one of AC or DC power, and utilize conductive elements, or traces, formed on a substrate to provide a reliable and highly functional lamp.

Figure 1:
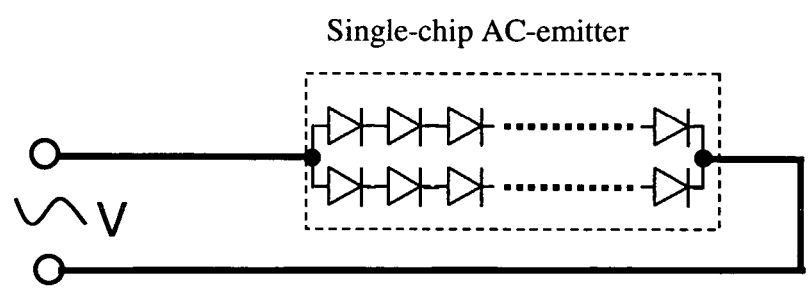
FIG. 1 is a circuit diagram showing the LED build of a high voltage single chip AC-emitter.
Figure 2:
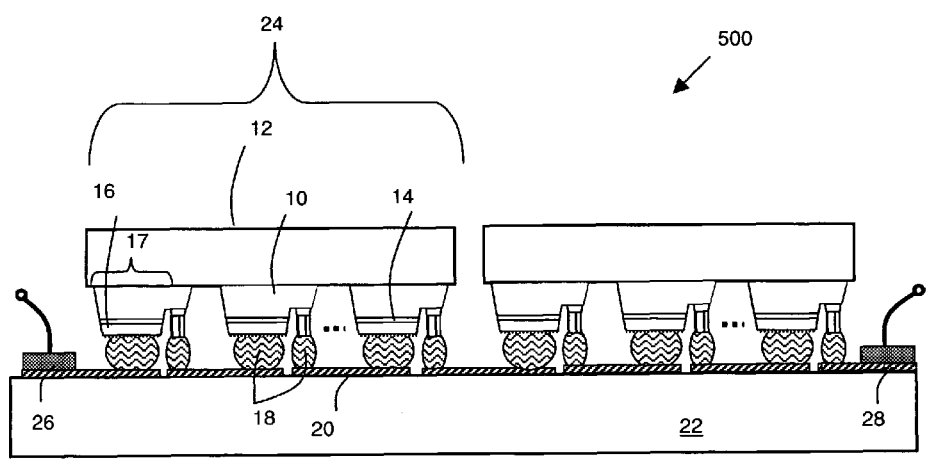
FIG. 2 is a side elevational view showing the LED emitters bonded in upside-down fashion with conductive elements on a submount to form the SSL-LED lamp.

It should be understood that various methods may be employed to form single-chip high voltage LED suitable to receive AC or DC power input, such as those described in the '296 application incorporated by reference in the present disclosure. As seen in FIG. 2, layers of n-type semiconductor material 10 are deposited on a semi conductive chip 12, followed by optically active, or light-emission, layer 14, and then p-type semiconductor material 16 to form an individual LED 17. Metallic solder-like conductive bonding bumps 18 may be used along with conductive element pathways 20 formed on the electrically insulating substrate or submount 22 to conductively connect each individual LED 17 with other individual LED 17 on the particular semi conductive chip 12 to form an LED emitter 24. A conductive circuit is formed across the surface of the submount 22 and between LED emitters 24 by the conductive pathways 20. The circuit formed thus provides electrical current to each LED emitter 24 in the circuit to provide an overall SSL-LED lamp 500. This configuration also places the LED emitters 24 in an upside-down mounted arrangement on the submount 22. To improve heat dissipation while providing a degree of electrical insulation, the base of submount 22 consists of the thermal conductive but electrical insulating materials, such as AlN and Si, or is insulator covered metals, such as of low-temperature co-fired ceramic-on-metal (LTCC-M), aluminum silicon carbide (AlSiC) metal matrix composite materials, or metal-core board.

Although one particular series circuit path is depicted in FIG. 2, various series and parallel circuit paths may be implemented with a given SSL-LED lamp 500, as will be more fully explained herein. AC or DC voltage is applied at positive and negative posts 26 and 28 connected with the conductive pathways 20. Conductive pathways 20 may be deposited metal connections, for example Ni/Au metal stacks. Metallic bonding bumps 18 can be PbSn (lead-tin) or other solder balls, Au, In, Cu or other metallic structures. Also, n-type gallium nitride (n-GaN), indium gallium nitride/gallium nitride multiple quantum wells (InGaN/GaN MQW) optically active layers and p-type gallium nitride (p-GaN) in succession on a sapphire substrate may be chosen, as one example of a suitable arrangement for an individual LED 17. Also, it should be understood that the submount 22 may be fully electrically insulating throughout, or merely have an electrically insulating top layer.

The electrical insulation between adjacent LEDs 17 on a particular chip 12 may be accomplished by etching (dry or wet chemical etching) into the substrate of the chip 12 so that no light emitting material is present between the LEDs 17. An insulating film such as silicone dioxide ($SiO_2$) is subsequently deposited on the etched surface.

Figure 3A:
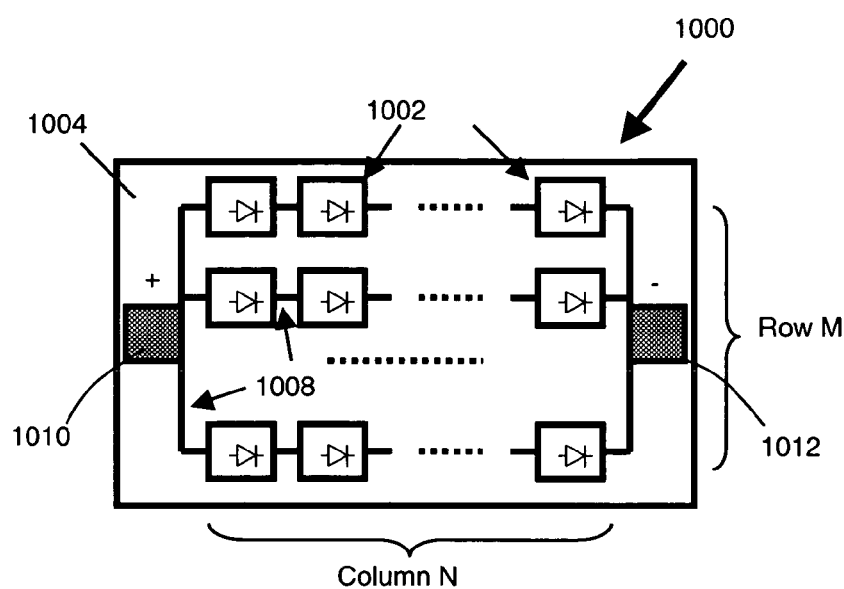
FIG. 3 shows plane views of: (a) one DC-SSL-lamp built on DC-emitters, (b) DC emitter with one current path, and (c) DC-emitter with multiple current path in parallel.
Figure 3B:
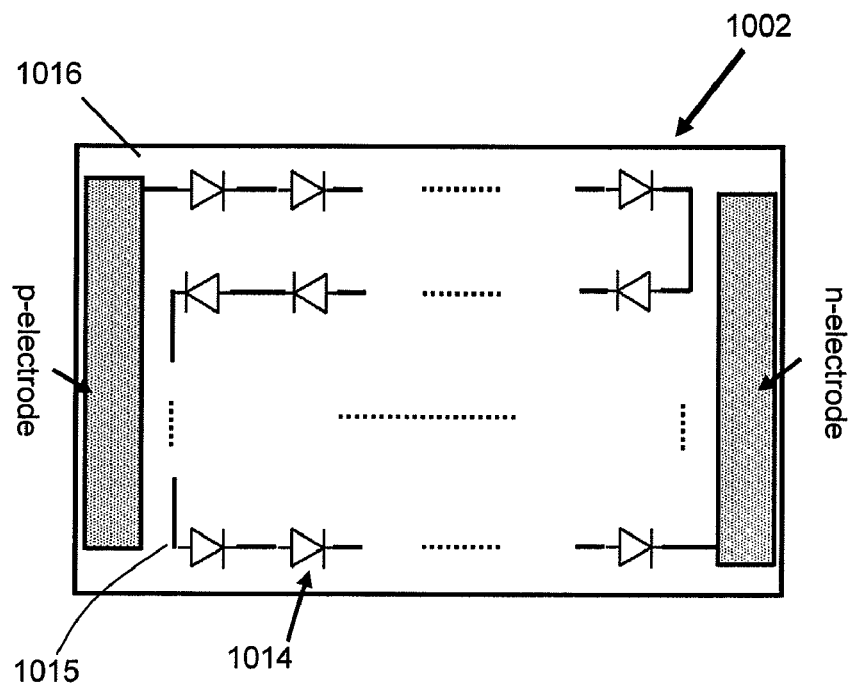
Figure 3C:
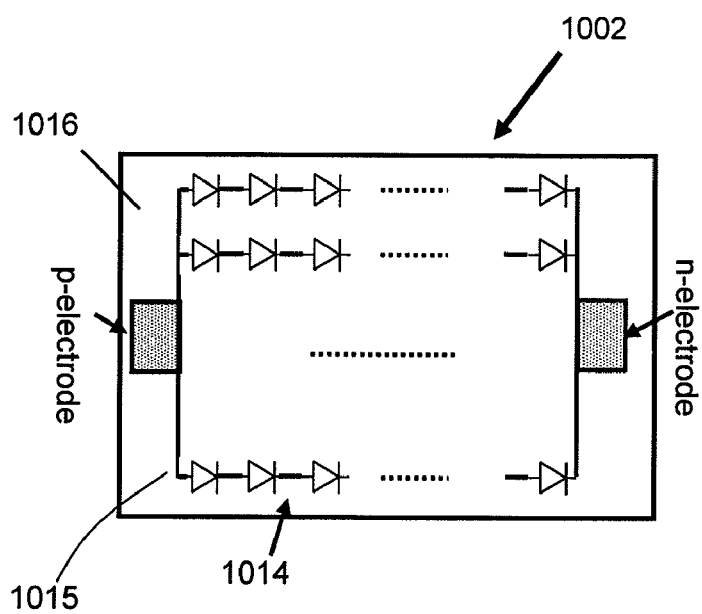

FIG. 3(a) illustrates associated embodiments of an SSL-LED lamp similar to the lamp 500 shown generally in FIG. 2. The SSL-LED lamps of FIG. 3(a) are formed as solid-state lighting lamps working under a high DC voltage, referred to herein as a DC-SSL-lamp 1000. A plurality of DC LED emitters 1002 are mounted on a submount 1004 through metallic bonding bumps and conductive pathways 1008 similar to those of the SSL-LED lamp 500 of FIG. 2, which interconnect adjacent DC LED emitters 1002. The submount has two outlets as positive and negative posts 1010 and 1012 for connection to a DC power supply. Each DC LED emitter 1002 shown in FIGS. 3(b) and 3(c), includes an array of small-size individual LEDs 1014 which may be constructed, for example, in the configuration of the LEDs 17 of the embodiment of FIG. 2 with conductive traces 1015 interconnecting the LEDs 1014. One particular arrangement of the LEDs 1014 is a serial integration onto a semi conductive emitter chip 1016 to form one DC LED emitter 1002, as shown in FIG. 3(b). Another LED 1014 arrangement is with multiple current paths connected in parallel format to form one DC LED emitter 1002, as shown in FIG. 3(c). The arrangement and mounting method of the DC LED emitters 1002—including the use of the metallic bonding bumps such as bumps 18 of FIG. 2—ensures that heat generated at the p-n junction of each LED 1014 can rapidly and uniformly transfer to the submount 1004, and light can be effectively extracted out and uniformly distributed. The number of emitters and the connection method depends on the working voltage and light flux (or power) specifications. Typically the emitters are arranged into a 2-dimensional array with resulting in M×N LED emitters 1002: N emitters 1002 serially connected into a current path and M current paths in parallel connected. If the supplied DC voltage is a known given amount, the number of LED emitters 1002 is preferably selected to achieve a specific voltage drop across each emitter (e.g., 3.4 volts). The parallel current paths also aid in reducing the number of broken current paths within the lamp 1000, maintaining as many LED emitters 1002 illuminated as possible while reducing the tendency for the voltage to exceed the allowable voltage across a given emitter 1002.

For the DC-SSL-lamp 1000 of FIG. 3a, AlInGaN based semiconductors grown on sapphire substrate may be used to build the lamp 1000. This configuration allows for a specification of working voltage of 120V DC and white illumination intensity equivalent to a 60 W incandescent light bulb. The white light may be accomplished, for instance, by the combination of blue or UV emission from AlInGaN based semiconductor p-n junction and color conversion phosphors.

Figure 4A:
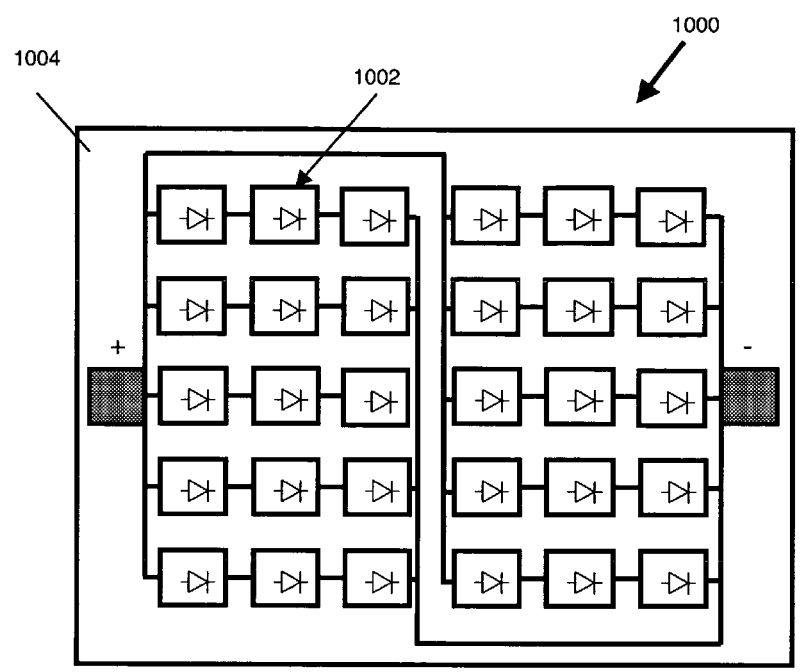
FIG. 4 shows plane views of one DC SSL-lamp of 120V DC and 250 mA based on (a) 40V and 25 mA DC-emitter, and (b) 40V and 125 mA DC-emitter.
Figure 4B:
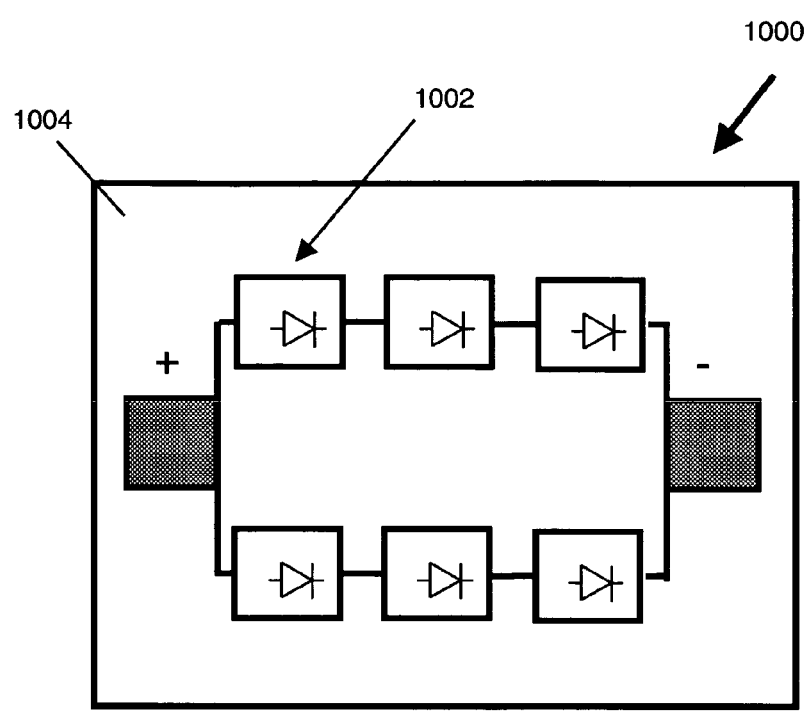

With the present LED techniques, assume that the DC-SSL-lamp 1000 has the double efficiency of incandescent light bulb, consuming 30 W or 250 mA. If each DC LED emitter 1002 consists of 10 individual LEDs 1014 serially interconnected together, and the emitter 1002 normally works under 40V DC and 25 mA, then a total of 10×3 emitters are required with 10 current paths and each path consisting of 3 emitters 1002 in serial. FIG. 4(a) illustrates the arrangement with a square-shape submount 1004 to uniformly distribute the light and heat generated by the DC LED emitters 1002. If each emitter 1002 is constructed with 5 current paths in parallel running under 40V and 125 mA, then forgoing specified SSL-lamp is built with 2×3 emitters, as illustrated in FIG. 4(b). Since the sapphire substrate of the emitters 1002 has a high thermal resistance, the emitters 1002 are facing-down mounted on the submount 1004 to enhance the heat dissipation into the submount 1004, with the light being extracted from the upright transparent sapphire side of the emitter 1002. All the interconnections between the emitters 1002 are preferably accomplished through the conductive pathways 1008 and bonding bumps (e.g., metallic bonding bumps 18) on the submount 1004. For each emitter 1002, the connection between individual LEDs 1014 on a chip 1016 are either accomplished by conductive traces 1015 on the emitter chip or through the conductive pathways 1008 and bonding bumps on the submount 1004.

Although semiconductor LEDs typically have a long lifespan, illumination intensity does degrade over time, and further deterioration may lead to a short or open circuit. Uniformity of light emission is also of concern, particularly where LED emitters have regions where a high level of heat is encountered. The reliability and performance uniformity of SSL-lamps based on an array of LED emitters, each constructed of a plurality of individual LEDs, can be further enhanced by providing redundant current paths across a circuit. Such an arrangement compensates for the discrepancy between the group elements of emitters and the group elements of individual LEDs, and further offsets the negative effects of catastrophic failure on the level of individual emitters and on the level of individual LEDs. These redundant interconnections on the emitter level are accomplished by the conductive pathways 1008 on the submount 1004, while on the individual LED level, they are accomplished by the same conductive pathways 1008 on the submount or by the conductive traces 1015 on the emitter chip.

Figure 5:
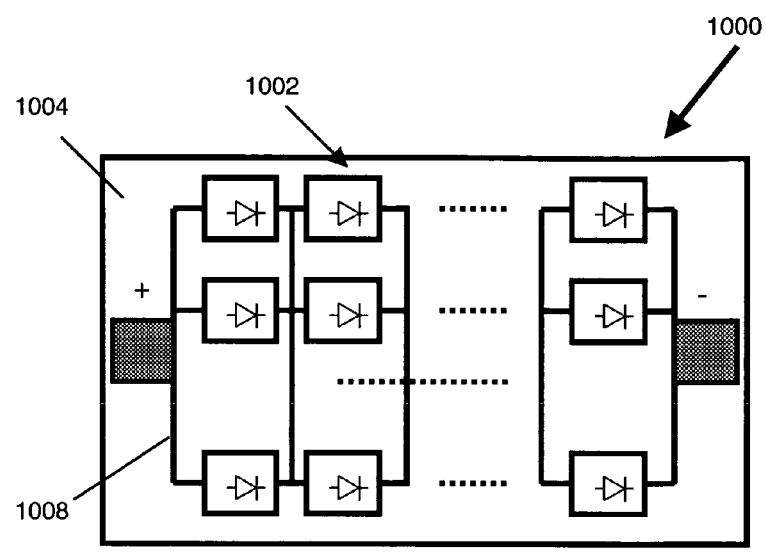
FIG. 5 shows a plane view of the DC-SSL-lamp in FIG. 3(a) with redundant current paths at the emitter level.

One embodiment employing the redundant current paths is illustrated in FIG. 5, which is a modification of the embodiment of the DC-SSL-lamp 1000 of FIG. 3(a). By this arrangement for a DC-SSL-lamp 1000, the DC LED emitters 1002 are conductively interconnected in row-wise and column-wise X-Y fashion, in series and in parallel. One advantage of this design is that if one of the emitters 1002 catastrophically fails in the configuration of FIG. 3(a) to form an open circuit, a corresponding current path opens to cause all emitters 1002 in the path to receive no current and thus not illuminate. The DC-SSL-lamp 1000 of FIG. 5, on the other hand, does not end up with an open circuit when an emitter 1002 fails because the break in the current pathway is isolated due to the redundancy; other emitters 1002 on the circuit will continue to work. In another situation, even if the performance of one emitter 1002 is significantly degraded due to failure of an individual LED 1014 of the emitter, current redistribution along other pathways of the circuit commences, ensuring that the remaining emitters 1002 receive current within a range that is acceptable for the design of the emitters 1002 in order to provide adequate illumination.

It should also be appreciated that with each DC LED emitter 1002 consists of a certain amount of individual LEDs 1014 in serial connection that, when redundantly connection, makes it unlikely that all the individual LEDs 1014 of one emitter 1002 would be shorted to completely short circuit that emitter 1002. In fact, on the component LED 1014 level of the emitter 1002, if one LED 1014 has a short circuit after breakdown, since the current path is constructed with multiple LEDs 1014, for example, 10 LEDs for a 40V DC-emitter, the extra voltage caused by a shorted LED 1014 will be uniformly allocated on the remaining 9 LEDs. This would provide a voltage variation on each LED of about 10%, which is an acceptable value based on the durability of the LEDs 1014 being formed. As such, the emitter 1002 would not encounter significant performance and reliability degradation.

Building on the concepts discussed about with respect to the forgoing DC-SSL-lamp 1000 embodiments, related configurations for AC-SSL-lamps 2000 and AC LED emitters 2002 are illustrated in FIGS. 6-11(b). The AC lamps 2000 may employ the DC LED emitters 1002 or AC emitters 2002 depending on the desired lamp characteristics. Additionally, the concepts of redundant interconnected current paths at the emitter level and/or at the individual LED level may be employed in the various embodiments, as will be explained herein.

Figure 6:
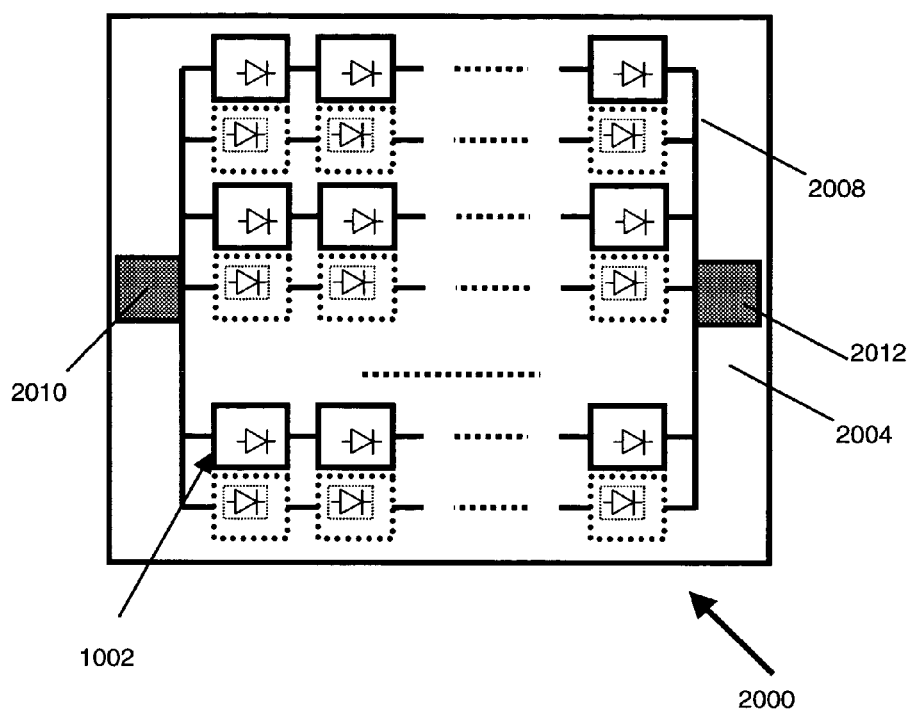
FIG. 6 shows a plane view of a one AC-SSL-lamp built on DC-emitters.

The AC-SSL-lamp 2000 of FIG. 6 provides an emitter arrangement similar to that of the DC-SSL-lamp 1000 shown in FIG. 3(a). Specifically, the AC-SSL-lamp 2000 utilizes a plurality of DC LED emitters 1002 partitioned into two groups and arranged in such a way to provide two parallel reversed-direction current paths, corresponding to the positive and negative cycles of AC voltage. In other words, one group of DC emitters 1002 is forward biased during one half of an AC power cycle and the other group of DC emitters 1002 is forward biased during the other half of an AC power cycle. Also, the positive and negative terminals of each group of DC emitters 1002 are connected with the respective inverse terminals of the other group of DC emitters 1002 (i.e., positive to negative, negative to positive), in order to create the reversed-direction current paths. As with the DC-SSL-lamp 1000, the plurality of DC LED emitters 1002 are mounted on a submount 2004 through metallic bonding bumps and conductive pathways 2008 similar to those of the SSL-LED lamp 500 of FIG. 2, which interconnect adjacent DC emitters 1002. The submount 2004 has two outlets as posts 2010 and 2012 for connection to an AC power supply.

Figure 7:
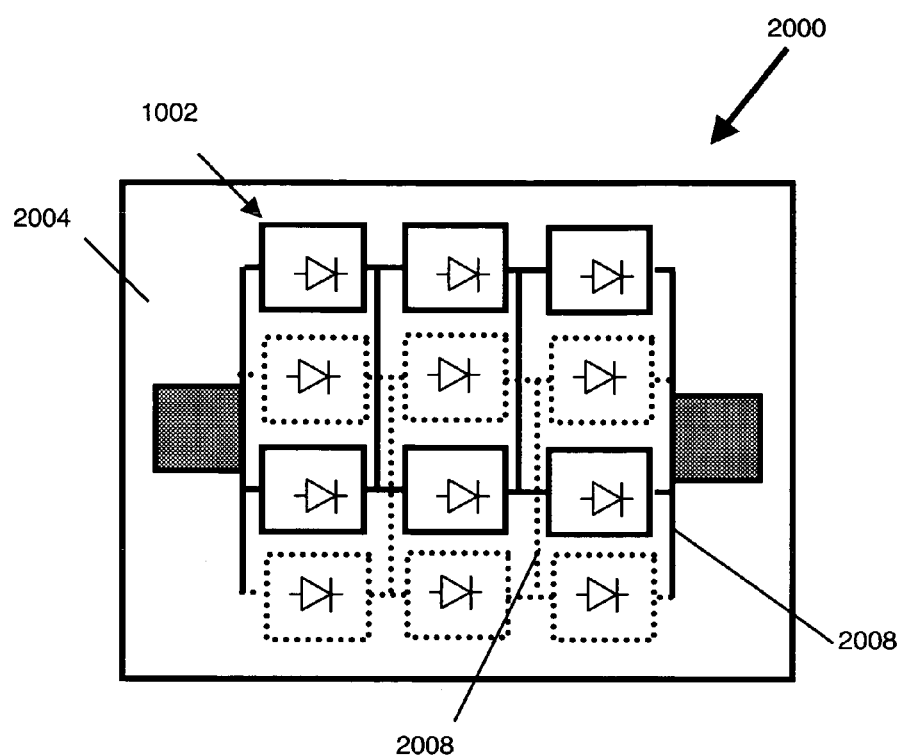
FIG. 7 shows a plane view of one AC-SSL-lamp of 120V AC and 250 mA based on 40V and 125 mA DC-emitter with redundant current paths.

As explained above with respect to certain aforementioned embodiments, the working voltage provided to the AC-SSLlamp 2000 and light flux will determine the number of DC LED emitters 1002 required. As one example, AlInGaN based semiconductors may be used to build the forgoing AC lamp 2000 with a specified working voltage of 120V AC and white illumination intensity equivalent to a 60 W incandescent light bulb. Assume that the AC lamp 2000 has the double efficiency of incandescent light bulb, thus consuming 30 W or 250 mA. If each of the DC emitters 1002 has a specification of 40V and 125 mA, then the associated specified AC lamp 2000 can be built with (2×3)×2 emitters, as illustrated in FIG. 7. The same strategies to enhance the reliability of the DC-SSL-lamp 1000 with redundant current paths may also be used for AC-SSL-lamp 2000. As exemplified by the AC lamp 2000 depicted in FIG. 7, redundant current paths built on the submount may be provided separately for the two current flowing directions, and provide series and parallel current paths.

Figure 8:
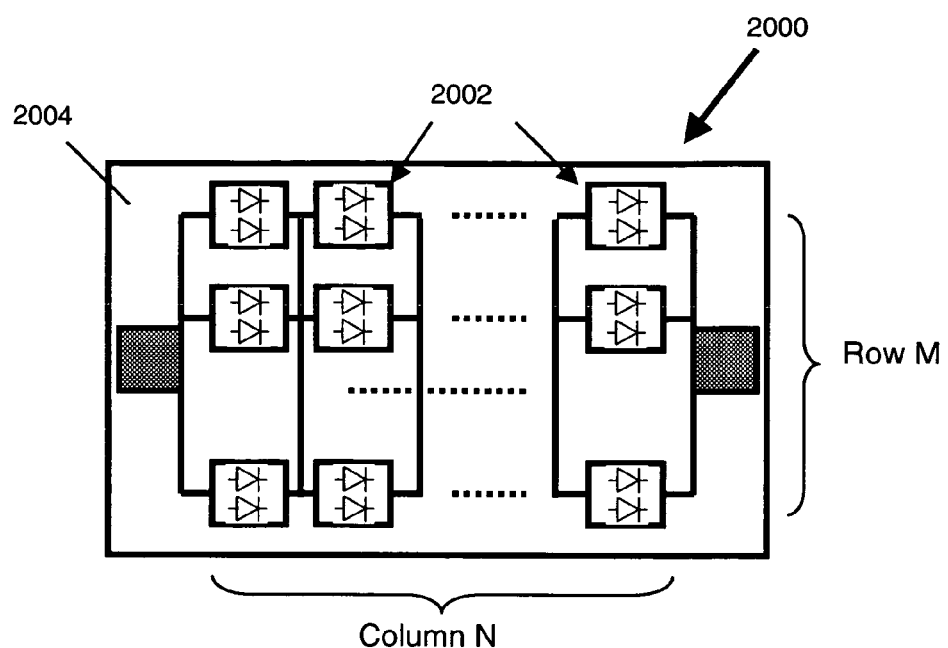
FIG. 8 shows a plane view of one AC-SSL-lamp built on AC-emitters with redundant current paths.
Figure 9:
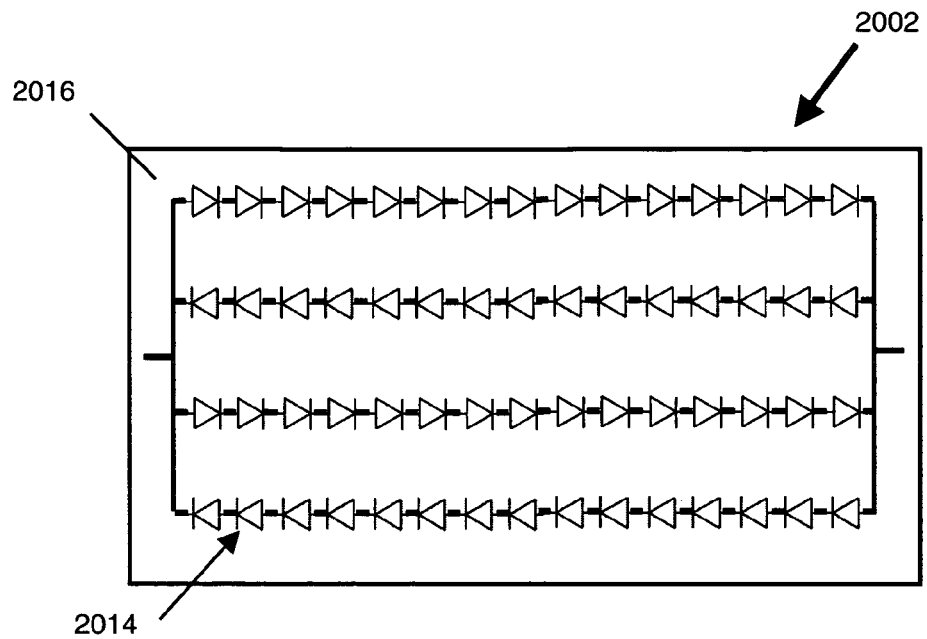
FIG. 9 shows plane views of (a) AC-emitter with a specification of 60VAC and 50 mA, (b) AC-SSL-lamp of 240V DC and 250 mA based on the AC-emitters in (a), and (c) the same AC-emitter but with redundant current path at the LED level.
Figure 9:
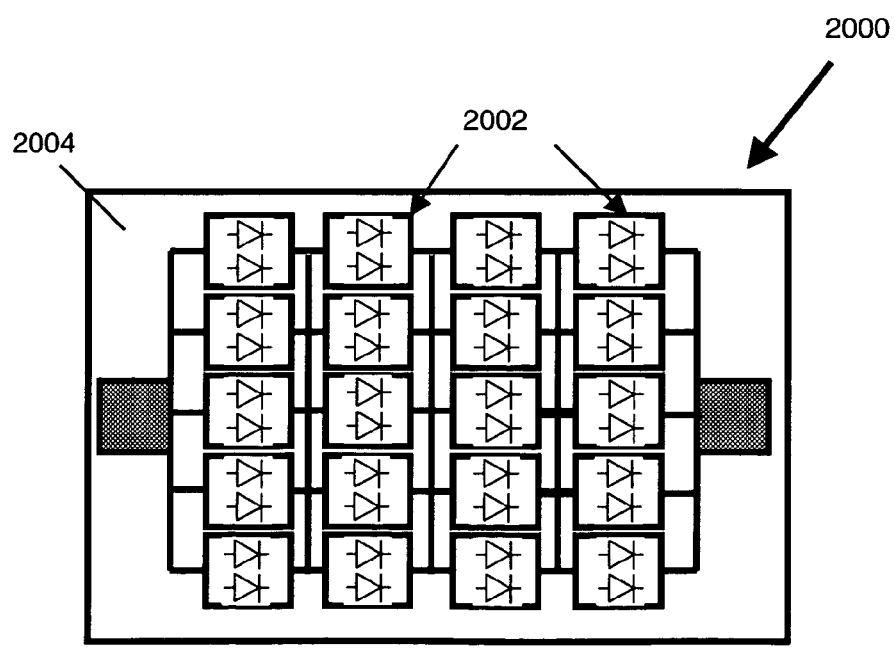
Figure 9:
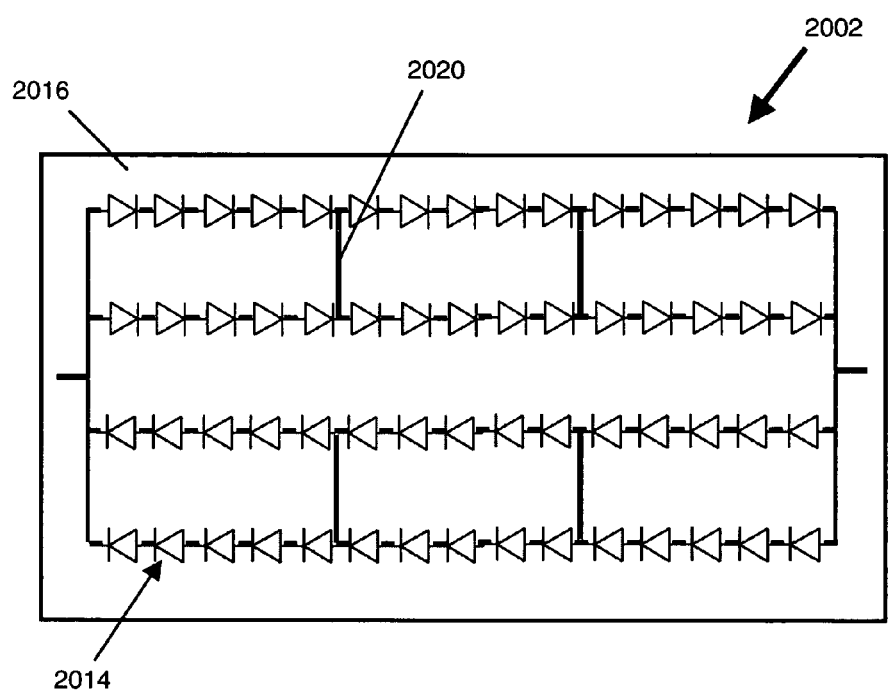
Figure 10:
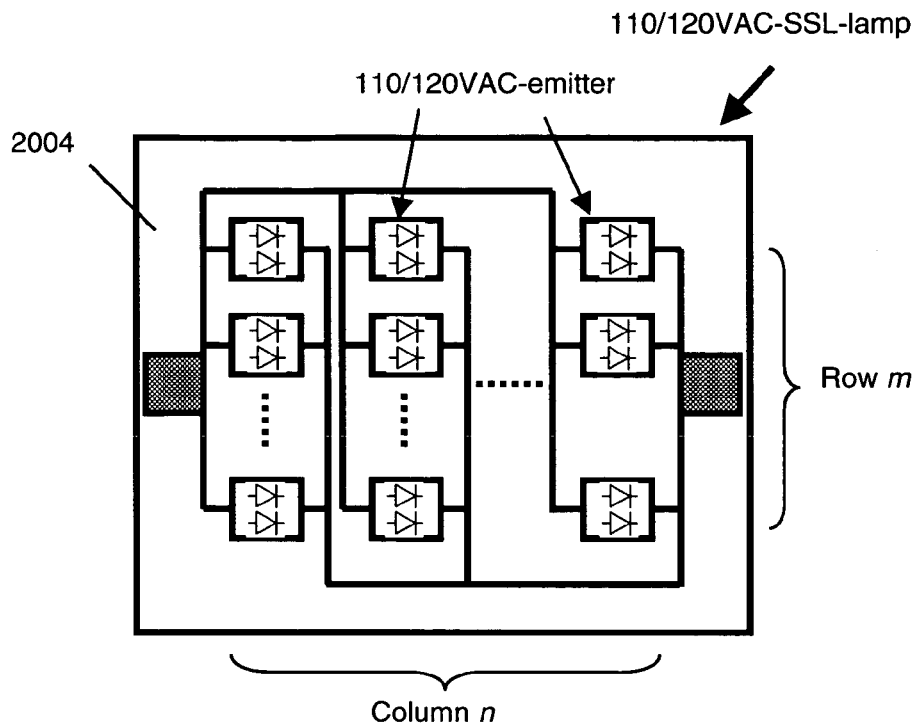
FIG. 10 shows plane views of (a) 110V/120V AC-SSL-lamp constructed from a plurality of 110V/120V AC-emitters in parallel connections arranged in m×n matrix format, and (b) with m=2 and n=2.
Figure 10:
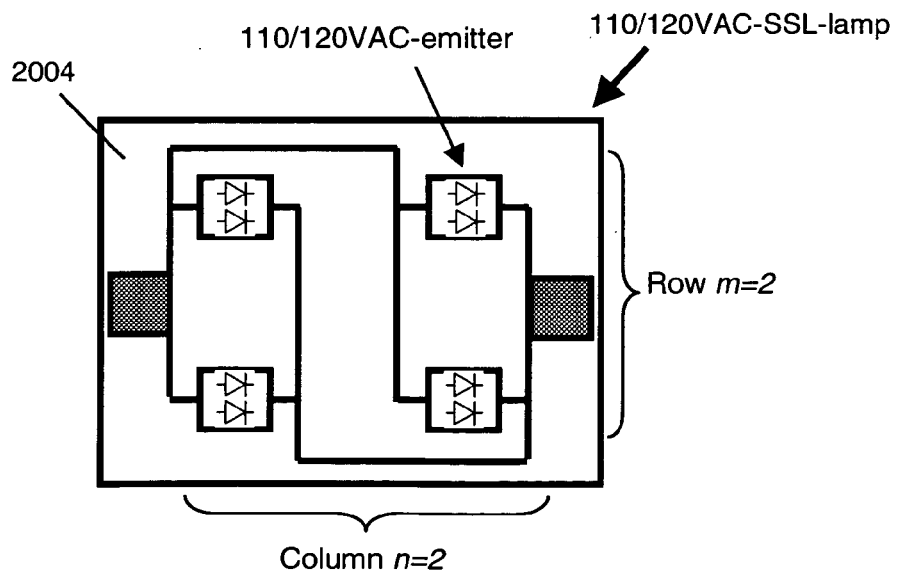

AC-SSL-lamps 2000 may also built by AC LED emitters 2002 instead of DC-emitters 1002. With each AC emitter 2002, two reversed-direction current paths have already been integrated on the associated chip, such as a semi conductive emitter chip 2016 shown in FIGS. 9(a) and 9(c). If the thermal stress on the chip 2016 caused by the two reversed current paths is not a significant issue, using AC emitters 2002 to build the AC-SSL-lamp 2000 has the advantage of higher integration of components. One embodiment of the AC-SSL-lamp 2000 build by AC LED emitters 2002 on the submount 2004 is shown in FIG. 8. As can be appreciated, the same strategies to enhance DC-SSL-lamp reliability can also be used for AC-SSL-lamps in the aforementioned embodiments.

Continuing with another example, where AlInGaN based semiconductors may be used to build the AC lamp 2000 with a specified working voltage of 120V AC and double efficiency of incandescent light bulb (consuming 30 W or 250 mA), one AC LED emitter 2002 illustrated in FIG. 9(a) may be used as a standard emitter for various embodiments of the AC lamp 2000. The AC emitter 2002 of FIG. 9(a) has 15 individual LEDs 2014 in serial connection for each current path, with 4 parallel paths provided on the chip 2016. If each LED runs at 25 mA with a forward voltage of 4V, then the AC emitter 2002 is specified to run on 60V AC with a current of 50 mA. With this configuration, the AC lamp 2000 of FIG. 9(b) may be fabricated to run on 240VAC and 250 mA. The AC emitters 2002 form a 2-dimensional array with resulting in a 4×5 grid arrangement with 4 AC-emitters in the row direction and 5 in the column direction. The redundant conductive traces 2020 on the chip 2016 shown in FIG. 9(c) at the individual LED 2014 level, and redundant pathways on the submount 2004 shown in FIG. 9(b) at the AC emitter 2002 level, improve the lifespan and performance of the AC lamp 2000 overall, and of each emitter 2002.

One specific AC-SSL-lamp 2000 design is based on the usage of 110V/120V AC-emitters 2002 (similarly, 220V/240V AC-SSL-lamp is based on the 110V/120V or 220V/240V AC-emitters). The standard 110V/120V AC-emitter 2002 has an optimized current $I_0$. The 110V/120V AC-SSL-lamp 2000 is constructed with (m×n) of the standard 110V/120V AC-emitters in parallel connection to achieve a total current of (m×n)$I_0$, as illustrated in FIG. 10(a). In FIG. 10(b), m=2 and n=2, so the lamp has a total current of $4I_0$. As with previous embodiments of the AC lamp 2000, and although not shown, redundant current paths may be provided between the 110V/120V AC-emitters 2002 (and optionally at the individual LED 2014 level) to enhance lamp reliability.

Figure 11A:
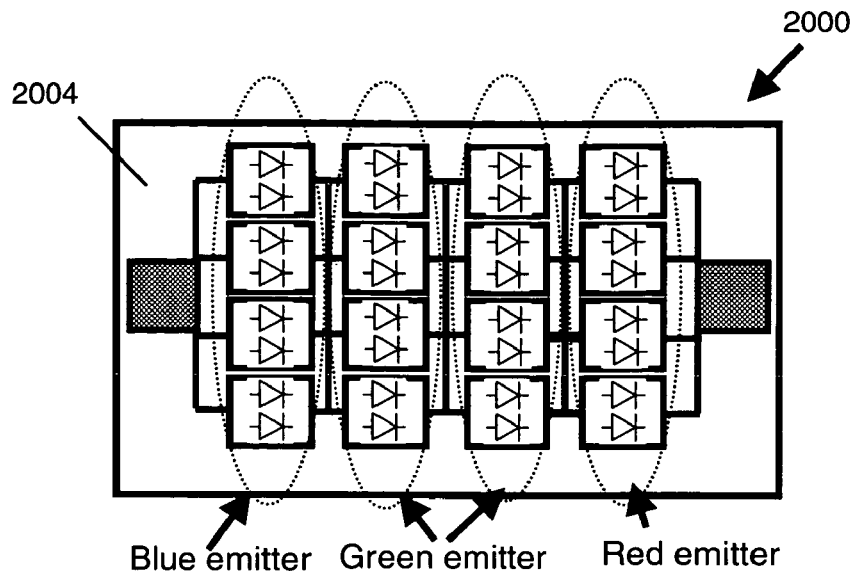
FIG. 11 shows plane views of (a) the SSL-lamp constructed by blue, green and red color emitters in serial connections to produce white light emission by color mixing, and (b) 110V/120V AC-SSL-lamp constructed by a certain amount of 110V/120V AC-emitters with blue, green and red emission.
Figure 11:
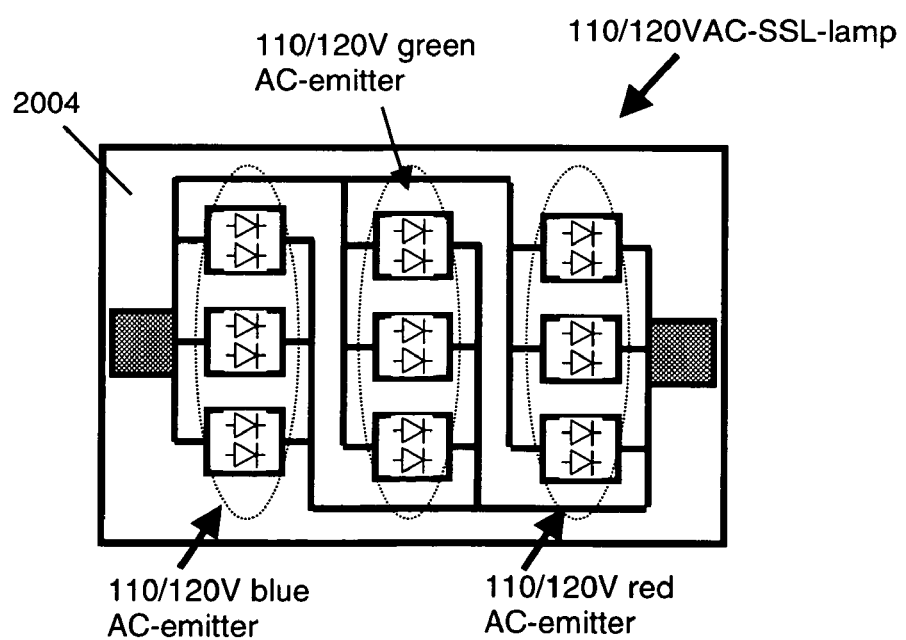

Although AlInGaN semiconductor emitters have been described for use in various embodiments of the SSL-LED lamp, it should be understood the present invention can also be used to construct SSL-lamps based on other semiconductor materials such as GaAs, InP, with different emitting wavelengths. As another optional configuration, AC or DC emitters used to build the SSL-LED lamp can comprise different light emitting materials with different emission wavelengths. This is especially useful in the fabrication of a white LED lamp based on blue, green, and red color mixing. FIG. 11(a) shows one embodiment of the AC-SSL-Lamp 2000 where blue, green and red color DC or AC emitters are integrated on the same submount 2004. The number of emitters of each color provided for the lamp 2000 can be varied so that the mixed color can be changed, e.g. adjusting the "temperature" of the white color as perceived by the viewer. FIG. 11(b) illustrates one embodiment of the 110V/120V AC-SSL-lamp 2000 constructed with 110V/120V red, green and blue AC-emitters 2002 providing color mixing. The number of AC emitters 2002 of each color provided, and the total number of AC emitters 2002, will depends on the color temperature and the brightness requirement of the SSL-LED lamp.

Figure 12:
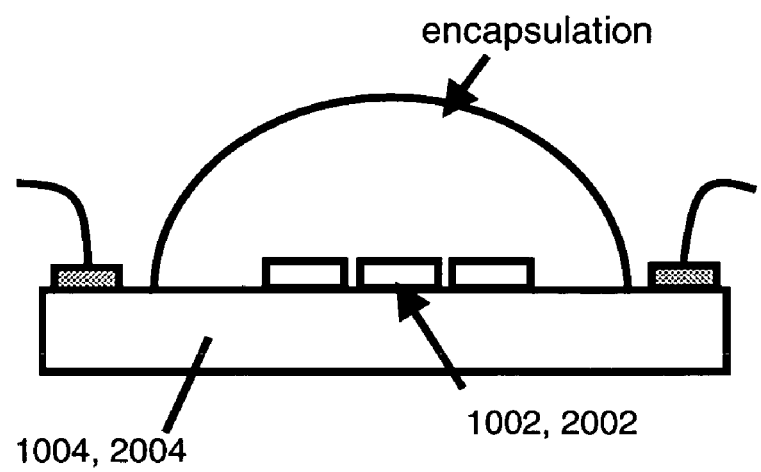
FIG. 12 shows sectional views from a side elevation of (a) a small surface area SSL-lamp with one dome-shape encapsulation, and (b) a large surface area SSL-lamp with each emitter having a dome-shaped encapsulation.
Figure 12:
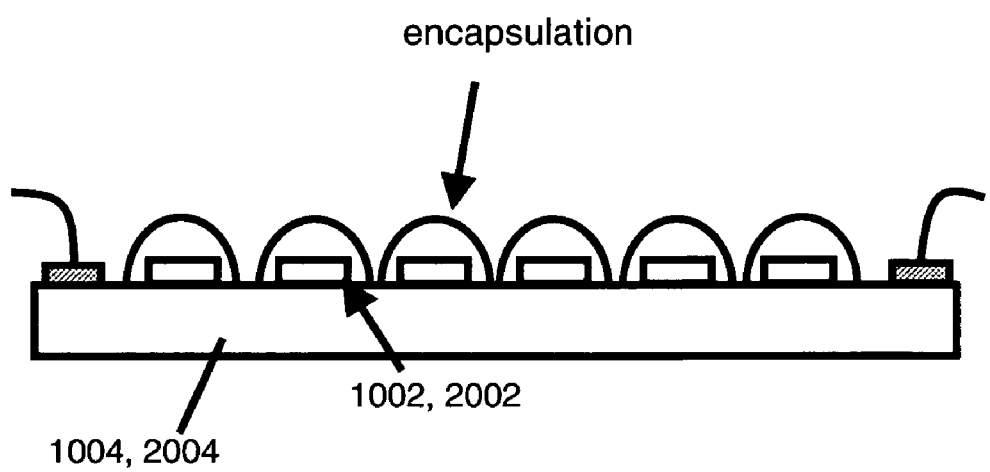

The DC/AC emitter based SSL-lamp operates most effectively with suitable encapsulation of the DC/AC emitters 1002, 2002 for light extraction and reliable performance, as illustrated in FIGS. 12(a) and 12(b). The encapsulation specifically protects the emitters 1002, 2002 from the surrounding environment, such as the positive and negative posts where a power source connects with the SSL-LED lamp (e.g., DC-SSL-Lamp 1000 or AC-SSL-Lamp 2000). For a SSL-LED lamp having a limited surface area with a small number of integrated emitters, all or a group of the emitters 1002, 2002 on the submount 1004, 2004 may be encapsulated in one dome formed by silicon or epoxy based optically-clear polymers, as shown in FIG. 12(a). Conversely, if the SSL-LED lamp has a large surface area, encapsulation may be separated over individual emitters 1002, 2002, as shown in FIG. 12(b). Individual encapsulation typically provides for a more uniform distribution of light emission or illumination. Suitable phosphors are incorporated in the encapsulation to achieve white light emission, if the emitters 1002, 2002 are based on AlInGaN semiconductors with blue or ultraviolet emission.

The aforementioned forgoing SSL-LED lighting lamps may be mounted with a standard screw base attached with the submount 1004, 2004, for example, for being affixed in a suitable lighting fixture while providing adequate light distribution and heat dissipation. For safety consideration, some passive protecting circuit elements (not shown), such as varistors, current limiting resistors or positive temperature coefficient thermistors, as examples, may be coupled with the circuit of the lamp directly on the submount, or combined in the light fixture design. Individual LEDs themselves have a very low dynamic resistance, and thus the supplied voltage transition, especially for the 110/120V or 220/240V AC power grid, can easily over-drive the LED device, seriously degrading its performance and lifetime. As one preferred arrangement, a varistor may be integrated in the lamp design, connected across the AC power input, to protect the integrity of the SSL-LED lamp. When a power surge or voltage spike is sensed, the resistance of the varistor resistance decreases rapidly, creating an instant shunt path and protecting the lamp itself.

While particular embodiments of the invention have been shown, it will be understood, that the invention is not limited thereto, since modifications may be made by those skilled in the art, particularly in light of the foregoing teachings. Reasonable variation and modification are possible within the scope of the foregoing disclosure of the invention without departing from the spirit of the invention.

What is claimed is:

1. An LED based solid-state lamp comprising:
a submount having electrically insulative properties;
conductive elements deposited on a surface of the submount; and
a plurality of high voltage LED emitters on a semiconductor chip, the emitters existing in an array on a surface on a substrate which is on an opposite side of the emitters from the surface of the submount;
the LED emitters being coupled with the surface on the submount and electrically connected with one another through the conductive elements, wherein the conductive elements are arranged in a configuration that includes a plurality of redundant conductive pathways between the emitters at the emitter level, the redundant pathways providing a ladderlike configuration of interconnections between emitters.

2. The lamp of claim 1, wherein the plurality of single-chip high voltage LED emitters are AC LED emitters, each comprising:
a semi conductive chip; and
a first set and a second set of series connected LEDs mounted to the chip, each of the first and second set of series connected LEDs having a forward biased direction of current flow, a reverse biased direction of no current flow opposite of the forward biased direction of current flow, and each set presenting positive and negative terminals;
wherein the positive terminal of the first set of series connected LEDs is connected to the negative terminal of the second set of series connected LEDs, and the negative terminal of the first set of series connected LEDs is connected to the positive terminal of the second set of series connected LEDs, such that a current from the AC power source energizes the first set of LEDs in the forward biased direction during a first half cycle of the AC power source and the current from the AC power source energizes the second set of LEDs in the forward biased direction during a second half cycle of the AC power source.

3. The lamp of claim 2, wherein the first set and second set of series connected LEDs are coupled with the submount with conductive bumps that interconnect the LEDs with the conductive elements.

4. The lamp of claim 1, wherein the plurality of single-chip high voltage LED emitters are DC LED emitters, each comprising:
a semi conductive chip having a positive electrode and a negative electrode for receiving a power source; and
a first set of series connected LEDs mounted to the chip and coupled with the positive and negative electrodes.

5. The lamp of claim 4, wherein the DC LED emitters further comprise:
at least a second set of series connected LEDs mounted to the chip and coupled with the positive and negative electrodes, each of the first and at least a second set of series connected LEDs arranged on the chip for a parallel connection with one another.

6. The lamp of claim 4, wherein the first set of series connected LEDs are coupled with the submount with conductive bumps that interconnect the LEDs with the conductive elements.

7. The lamp of claim 1, wherein the conductive elements are arranged on the submount so that the plurality of single-chip high voltage LED emitters are connected in series with one another.

8. The lamp of claim 1, wherein the conductive elements are arranged on the submount so that the plurality of single-chip high voltage LED emitters are connected in parallel with one another.

9. The lamp of claim 1, wherein the conductive elements are arranged on the submount so that that the plurality of single-chip high voltage LED emitters are connected in both series and in parallel with one another.

10. The lamp of claim 1, wherein the conductive elements are configured to provide one direction current flow through the plurality of single-chip high voltage LED emitters for DC voltage.

11. The lamp of claim 1, wherein the conductive pathways interconnect the plurality of LEDs in both series and in parallel with one another.

12. The lamp of claim 1, wherein the submount is formed of a thermally conductive material.

13. The lamp of claim 12, wherein the submount is formed from a thermally conductive material selected from the group consisting of aluminum nitride, boron nitride, ceramics, or silicon-based materials.

14. The lamp of claim 1, wherein the submount has an electrically conductive portion covered by an electrically insulating layer.

15. The lamp of claim 1, wherein the submount is formed from materials selected from the group consisting of low-temperature co-fired ceramic-on-metal (LTCC-M), aluminum silicon carbide (AlSiC) metal matrix composite materials, or metal-core board.

16. The lamp of claim 1, further comprising protective elements coupled to the submount for controlling power supplied to the plurality of single-chip high voltage LED emitters.

17. The lamp of claim 16, wherein the protective elements are selected from the group consisting of varistors, current limiting resistors or positive temperature coefficient thermistors.

18. The lamp of claim 1, wherein the plurality of single-chip high voltage LED emitters emit varying wavelengths of light.

19. The lamp of claim 1, wherein at least some of the plurality of single-chip high voltage LED emitters are encapsulated together on the substrate to isolate the encapsulated LED emitters from the surrounding environment as well as positive and negative terminals where a power source is connected to the substrate.

20. An LED based 110V/120V AC-SSL-lamp comprising:
a substrate including a plurality of high voltage LED emitters arranged in an m×n matrix (m≧1, n≧1);
a submount having electrically insulative properties; and
conductive elements disposed on a surface of the submount;
wherein the LED emitters are mounted on a surface on the substrate which is on an opposite side of the emitters from the surface of the submount; and
wherein the LED emitters are electrically connected with one another through the conductive elements via ladderlike vertical and horizontal redundant segments that form at least two redundant flow paths between a first LED emitter and a second LED emitter within the matrix.

21. The lamp of claim 20, wherein the conductive elements are arranged on the submount so that the plurality of LED emitters are connected in parallel with one another.

22. The lamp of claim 20, wherein the conductive elements interconnect the plurality of LEDs in series with one another.

23. The lamp of claim 20, wherein the plurality of LED emitters include at least a first portion of LED emitters constructed of materials producing a first type of color emission, and a second portion of LED emitters constructed of materials producing a second type of color emission, wherein the combinations of the first and second types of color emissions appear to the human eye to be a white light emission.

24. An LED based 220V/240V AC-SSL-lamp comprising:
a substrate including a plurality of AC LED emitters arranged in m×n matrix format (m≧1, n≧1);
a submount having electrically insulative properties; and
conductive elements disposed on a surface of the submount;
wherein the AC LED emitters on the substrate are flip-chip mounted onto the submount, the AC LED emitters each being mounted on a surface of the substrate, the surface of the substrate being opposite the surface of the submount; and
wherein the AC LED emitters are electrically interconnected through the conductive elements such that every AC LED emitter is connected both in parallel in series with at least one other AC LED emitter in a ladder configuration to create redundant current paths on the chip level.

* * * * *